United States Patent
Alenkov et al.

(10) Patent No.: US 6,302,956 B1
(45) Date of Patent: Oct. 16, 2001

(54) LANGASITE WAFER AND METHOD OF PRODUCING SAME

(75) Inventors: Vladimir Vladimirovich Alenkov, Moskovskaya obl.; Oleg Alexeevich Bouzanov, Moscow; Alexandr Borisovich Gritsenko, Moscow; Georgy Georgievich Koznov, Moscow, all of (RU)

(73) Assignee: Rafida Developments, Inc. (VG)

( * ) Notice: Subject to any disclaimer, the term of this patent is extended or adjusted under 35 U.S.C. 154(b) by 0 days.

(21) Appl. No.: 09/380,998
(22) PCT Filed: Dec. 30, 1997
(86) PCT No.: PCT/RU97/00426
  § 371 Date: Nov. 8, 1999
  § 102(e) Date: Nov. 8, 1999
(87) PCT Pub. No.: WO98/40544
  PCT Pub. Date: Sep. 17, 1998

(30) Foreign Application Priority Data

Mar. 12, 1997 (RU) ................................................ 97103750
Apr. 22, 1997 (RU) ................................................ 97106626
Sep. 24, 1997 (RU) ................................................ 97115565

(51) Int. Cl.[7] .................................................. C30B 15/02
(52) U.S. Cl. ................................. 117/13; 117/19; 117/20
(58) Field of Search .................................. 117/13–19, 20

(56) References Cited

FOREIGN PATENT DOCUMENTS

| 1220394 A | 5/1984 | (RU) . |
| 1228526 A1 | 9/1984 | (RU) . |
| 1354791 A1 | 2/1986 | (RU) . |
| 1506951 A1 | 12/1992 | (RU) . |

OTHER PUBLICATIONS

Russian document , 1982. Tom 264, No. 6, pp. 1385–1389.

Aspects of Growing Langasite Crystals and Their Properties, Gotalskaja et al., Journal De Physique IV, 1994 pp. C2–201–C2–205.

Investigation of Trigonal . . . Crystals, A. A. Kamanskii et al., Phys. stat. sol. (a) 80,387 (1983), pp. 387–399.

1994 IEEE International Frequency Control Symposium, Langasite . . . An Optical Piezoelectric: Growth and Properties, pp. 43–47.

Growth and characterization of lanthanum gallium silicate . . . single crystals for piezoelectric applications, Shimamura et al., pp. 388–392, Nov. 18, 1995.

*Primary Examiner*—Felisa Hiteshew
(74) *Attorney, Agent, or Firm*—J. Herbert O'Toole; Hardaway/Mann IP Group

(57) ABSTRACT

The invention relates to the field of electronics and can be used in acoustic electronic frequency-selective devices in surface acoustic waves (SAW) and volumetric acoustic waves. The purpose of the invention is the formulation of an industrial process to develop stoichiometrically structured monocrystals of lanthalum gallium silicate, of no less than 75 mm in diameter and greater than 3,5 kg in weight, along a direction of <01.1>±3°. The discs are cut out at a 90° angle with respect to the lengthwise axis, thereby ensuring that the value of the frequency temperature coefficient is zero.

8 Claims, 2 Drawing Sheets

LANGASITE WAFER AND METHOD OF PRODUCING SAME

TECHNICAL FIELD

The present invention relates to radioelectronics and can find application in acoustoelectronic frequency-selective devices operating on surface acoustic waves (SAW) and volume acoustic waves (VAW).

BACKGROUND ART

SAW- and OAW-devices possess great potentialities whose practical realization involves developing new materials and cheaper techniques of growing piezoelectric crystals having preset quality and dimensions.

Single crystals of langasite ($La_3Ga_5SiO_{14}$) prove to be a promising piezoelectric material useful for providing modern radioelectronic equipment with small-size selecting devices as possessing a set of definite properties, i.e., langasite crystals are superior to berlinite as to dielectric constant and to quartz as to Q-factor. Their triclinic symmetry allows for the existence of cuts having a low or even zero temperature coefficient of frequency with an adequate value of the electromechanical-coupling coefficient.

Implementation of the new material, i.e., langasite will allow of reducing the cost of crystals, developing technology of their industrial production, and increasing the dimensions of grown crystals.

The closest to the proposed wafer and method of its production as to the technical essence and attainable result is a disk-shaped langasite wafer for SAW-devices (cf. K. Shimamura et al. "Growth and characterization of lanthanum gallium silicate $La_3Ga_5SiO_{14}$ single crystals for piezoelectric applications". J. of Crystal Growth, 1996, v.163, pp.388–392). The diameter of langasite wafers is not in excess of 50 mm because the known techniques of growing langasite crystals fail to produce quality crystals of a larger diameter. However, production process equipment used by the majority of domestic and foreign firms is designed for a minimum disk diameter of 76 mm (3 in), since said size minimizes losses in the devices along the disk periphery with respect to a-total number of devices on the entire surface of the disks.

One prior-art technique of growing single crystals of langasite by the Czochralski method is known to comprise high-frequency induction melting of a charge in a platinum crucible, said charge having been synthesized from a mixture of oxides of lanthanum, gallium, and silicon using the method of solid-phase synthesis, followed by air-pulling of the crystal from the melt onto an oriented seed (M. F. Dubovik et al., "Langasite ($La_3Ga_5SiO_{14}$), an optical piezoelectric growth and properties", 1994, IEEE International frequency control symposium, 1994, pp.43–47). The method allows of growing langasite crystals having a diameter of 60 to 70 mm and a weight of 1 kg, using a cylinder-shaped crucible 100 mm in diameter which is nearly equal to its height. The thus-grown crystals are then annealed at a temperature of 1623 K.

One more prior-art technique of growing single crystals by the Czochralski method is known to comprise high-frequency induction melting of presynthesized charge in a platinum crucible and pulling the crystals from the melt onto an oriented seed in the atmosphere of nitrogen doped with $O_2$ (3 vol. %) (A. A. Kaminski et al. "Investigation of trigonal ($La_{1-x}Na_x)_3Ga_3SiO_{14}$ crystals". Phys. stat. Sol. (a), 1983, v.80, pp.387–398). However, crystal growing in the atmosphere of pure nitrogen is accompanied by substantial evaporation of gallium oxide $Ga_2O_3$, while adding oxygen increases platinum content of the melt.

The inventors of another known technique of growing langasite crystals were to solve the problem of developing industrial-scale technique of growing langasite crystals by improving the construction arrangement of the thermal unit of the crystallization chamber (A. N. Gotalskaya et al. "Aspects of growing langasite crystals and their properties". Journal de physique IV, 1994, v.4, pp.201–210). The result was the grown crystals 62 mm in diameter and up to 2 kg in weight. Crystals are grown from a charge prepared by the method of solid-phase synthesis.

The closest to the proposed method as to the technical essence and the attainable result is a method involving the Czochralski technique of growing a langasite crystal, comprising charging a crucible with a presynthesized material corresponding to $La_3Ga_5SiO_{14}$ as for its composition, creating a shielding atmosphere followed by melting the feed material, bringing the rotating oriented seed crystal in contact with the melt surface, and pulling the oriented crystal from the melt (cf. K. Shimamura et al. "Growth and characterization of lanthanum gallium silicate $La_3Ga_5SiO_{14}$ single crystals for piezoelectric applications". Journal of Crystal Growth, 1996, v.163, pp.388–392). According to the known method, crystals are grown in an induction-heated growing apparatus. Once the feed material has been charged in a platinum or iridium crucible, crystals are grown in the stream of a gaseous mixture consisting of argon and oxygen (1–2 vol. %).

However, crystals grown by the known technique exhibit the onset of second phases, the properties of crystals are unreproducible from process to process, and numerous optically visible scattering centers appear. The situation is aggravated when attempt is made to grow crystals having a diameter exceeding 70 mm. Moreover, use of crystals grown by the known technique involves a heavy loss in material during manufacture of wafers because the latter are cut off at a large angle to the crystal growth axis.

The closest to the proposed method of preparing a synthesized material (charge) for growing single crystals of langasite is a method of preparing the charge by solid-phase synthesis by sintering the starting oxides of lanthanum, gallium, and silicon (B. V. Mil et al. "Modified rare-earth gallates having the structure of $Ca_3Ga_2GeO_{14}$". Transactions of the USSR Academy of Sciences, 1982, v.264, # 6, pp.1385–1389).

According to the known method, the oxides are mixed in a stoichiometric ratio, then sintered in an oxygen-containing atmosphere at 1300° C. However, the thus-prepared charge cannot be used for growing single crystals of langasite having a stoichiometric-ratio composition, since sintering of the metal oxides is accompanied with loss of the volatile component thereof. Lowering the sintering temperature below 1300° C. allows of reducing the loss of the volatile component which, however, results in a lower yield of lanthanum gallosilicate due to an incomplete proceeding of the reaction as to volume. To render the synthesis process more complete necessitates repeating the comminution of the synthesis product and mixing the oxides followed by their heating. This in turn results in fouling the end product, i.e., the langasite charge and hence in higher manufacturing cost thereof.

DISCLOSURE OF THE INVENTION

The present invention has for its principal object to provide an ecologically pure industrial-scale method of growing stoichiometric-composition single crystals of langasite having a minimum diameter of 76 mm (3 in) (of an inscribed circle) and a weight exceeding 3.5 kg, since said dimension minimizes the loss in devices along the disk periphery with respect to the entire surface of the disks. The resultant crystals should be free from optically detectable scattering centers and have such an orientation that wafers produced therefrom be so oriented that the value of the temperature coefficient of frequency approximates zero and loss in material be minimized.

The foregoing object is accomplished due to the fact that a disk-shaped langasite wafer for use in devices operating on SAW has a diameter of 75 to 80 mm and the disk has a base cut.

Furthermore, the foregoing object is accomplished due to the fact that in a known method of growing single crystals of langasite, using the Czochralski technique, comprising loading a crucible with a presynthesized material (charge) corresponding to $La_3Ga_5SiO_{14}$ as for its composition, creating a shielding atmosphere followed by melting the feed material, bringing the rotating oriented seed crystal in contact with the melt surface, and pulling the oriented crystal from the melt, said bringing the oriented seed crystal in contact with the melt surface is preceded by holding the molten material for 2 to 15 hours, the shielding atmosphere is established using a mixture of argon or nitrogen with atmospheric air taken in amount of from 2 to 15 vol. % with a total pressure of from 1.10 to 1.80 atm, which pressure is reduced, prior to contacting the seed crystal with the melt, to a value falling within the range of 1.00 to 1.09 atm.

The oriented seed crystal is rotated at 20 to 35 rpm.

Further on, used as the oriented seed crystal is a langasite crystal oriented in the direction of <01.1>±3°.

According to the present invention, once the crystals have been grown, they are held for 20 to 36 hours in the argon atmosphere at a temperature of from 1300 to 1673 K and a pressure of from 1.1 to 1.8 atm.

The foregoing object is accomplished also due to the fact that in a method of preparing a charge for growing single crystals of langasite, comprising mixing the oxides of lanthanum, gallium, and silicon, followed by heating the resulting mixture, metallic gallium is added to the mixture of oxides in the following ratio: $La_2O_3:Ga_2O_3:SiO_2=1: (0.2-0.3):(0.68-0.55):0.12$, and heating is conducted in the presence of an oxidant locally and transiently before the reaction of spontaneous high-temperature synthesis starts running.

Before being heated the gallium-doped mixture of the oxides is briquetted.

The local transient heating is carried out in an electric arc.

The essence of the method consists in that holding the melt within an experimentally found time interval ill combination with a change in the pressure of the shielding atmosphere in the specified range allows of a complete melt homogenizing process with a minimized loss of the volatile component (i.e., gallium suboxide).

The inventors have established experimentally an optimum range of changes in the value of the pressure of the shielding atmosphere, the melt holding time, the rotational speed of the seed crystal and its orientation, heat-treatment conditions, all this enabling, in conjunction with other essential features of the method, to attain the foregoing object of the invention. With the langasite seed crystal oriented in the direction <01.1> the crystals grow in said direction, whereby wafers can be cut off from the grown crystals at the right angles to the growth axis, thus minimizing loss of the material and a zero-approximating temperature coefficient of frequency. Thus, the proposed orientation of the langasite seed crystal allows of growing along the direction <01.1>.

The heat-treatment of the grown crystals carried out under the proposed conditions makes possible producing langasite crystals free from any mechanical stresses and optically detectable scattering centers. It is also worth noting that the proposed heat-treatment of single crystals of langasite modifies coloration of the crystal specimens. The optical transmission spectra of crystals are illustrated in FIG. 1. The test specimens are 2-mm thick langasite wafers before and after heat-treatment (cf. characteristic curves 1 and 2, respectively).

In order to prepare a charge for growing stoichiometric composition single crystals of langasite, metallic gallium is added to the mixture of oxides of lanthanum, gallium, and silicon in the range of concentrations as proposed herein. Then the mixture is heated locally until spontaneous high-temperature synthesis starts proceeding in, e.g., an electric arc. With such a heating, gallium undergoes oxidation accompanied with heat evolution, which heat renders the process, with the preselected concentrations of metal oxides and of metallic gallium, into the spontaneous high-temperature synthesis. Gallium oxide resultant from the combustion process reacts with lanthanum oxide to form an intermediate phase which reacts, on reaching a temperature of about 1673 K resulting from afterburning, with gallium and silicon oxide until $La_3Ga_5SiO_{14}$ is formed. The specific values of the selectable concentrations of gallium oxides are tabulated below.

| Charge composition, g | | | |
|---|---|---|---|
| $La_2O_3$ | $SiO_2$ | $Ga_2O_3$ | $Ga_{met}$ |
| 48,04 | 5,77 | 28,83 | 12,49 |
| 48,04 | 5,77 | 32,73 | 9,59 |
| 48,04 | 5,77 | 31,99 | 10,14 |
| 48,04 | 5,77 | 31,36 | 10,61 |
| 48,04 | 5,77 | 30,16 | 11,50 |
| 48,04 | 5,77 | 28,83 | 12,49 |
| 48,04 | 5,77 | 26,44 | 14,27 |
| 48,04 | 5,77 | 24,05 | 16,05 |

| Composition of resultant product, % | | | |
|---|---|---|---|
| $La_3Ga_5SiO_{14}$ | $LaGaO_3$ | b $Ga_2O_3$ | Ga |
| Base | 2,5 | None | None |
| Base | 3,5 | 0,5 | None |
| Base | 3,0 | None | None |
| Base | 3,5 | None | None |
| Base | 3,0 | None | None |
| Base | 2,5 | None | None |
| Base | 2,5 | None | None |
| Base | Melt | 10 + ($SiO_2$ *3%) | 3,5 |

The resultant charge material features a stoichiometric composition and is suitable for growing single crystals of langasite having a preset quality.

BRIEF DESCRIPTION OF THE DRAWINGS

In what follows the present invention will now be disclosed in a detailed description of an. illustrative embodiment thereof with reference to the accompanying drawings, wherein.

BEST METHOD OF CARRYING OUT THE INVENTION

Figure 1:
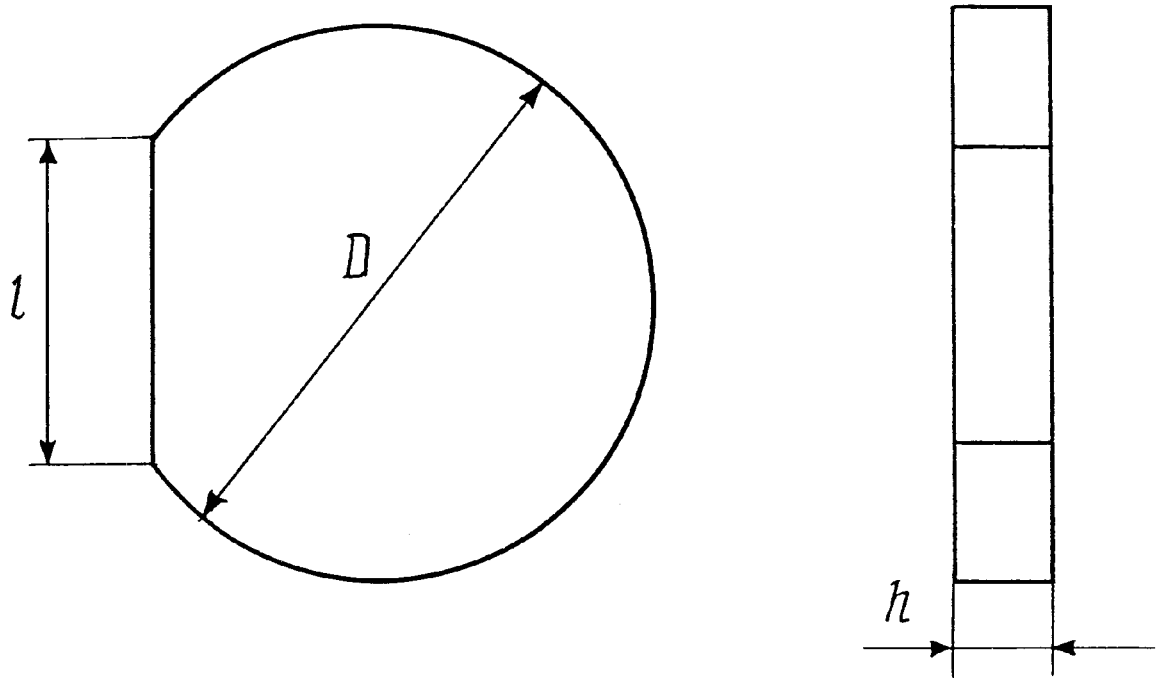
FIG. 1 illustrates optical transmission spectra of crystals.
Figure 2:
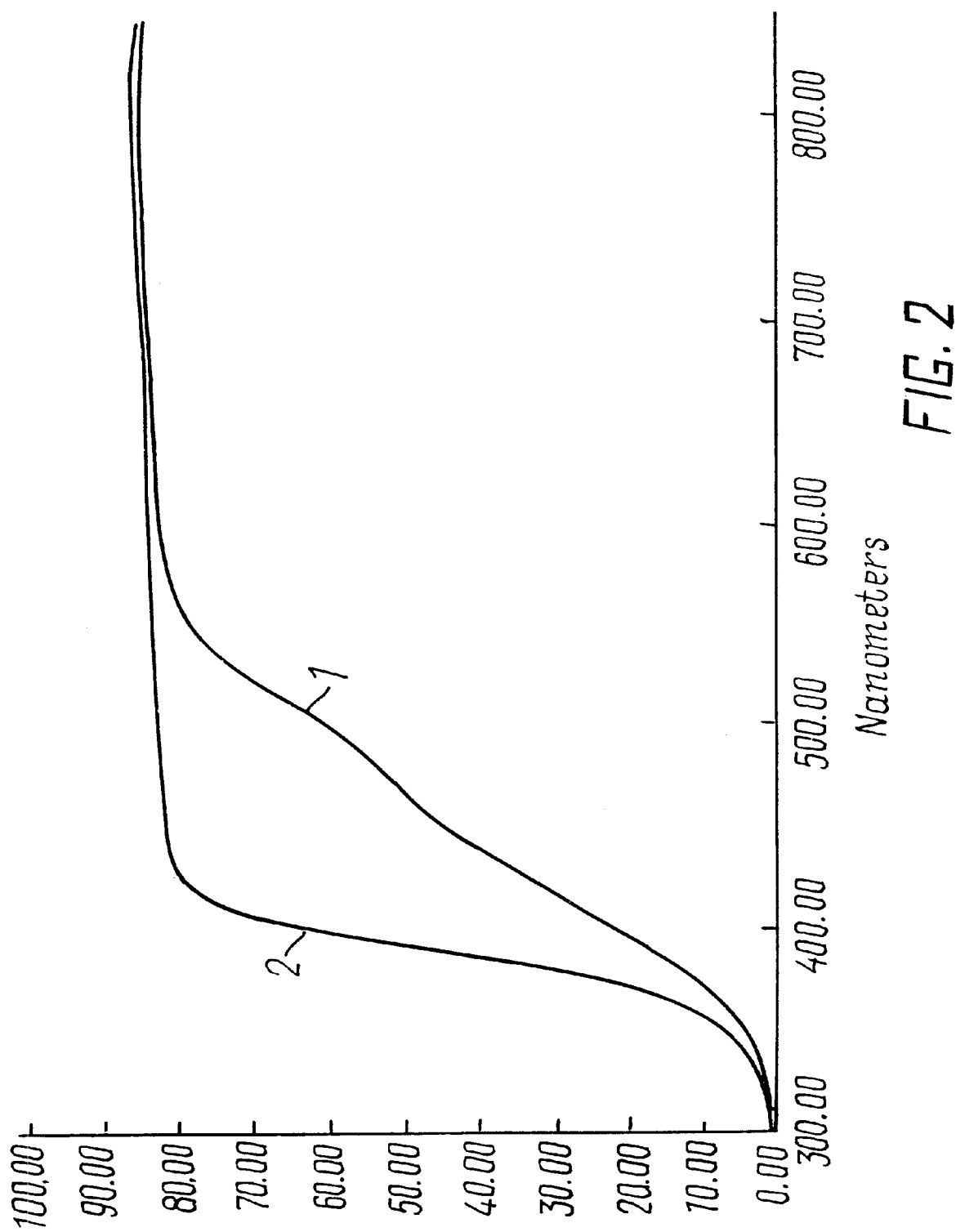
FIG. 2 illustrates construction arrangement of a langasite wafer having a diameter D, a thickness H, and a base cut with a length 1.

To produce langasite wafers having a minimum diameter of 75 mm, first crystals are to be grown, after having preliminarily prepared a starting material (charge), using spontaneous high-temperature synthesis. To prepare 100 g of the charge, there are taken grade III° C.–• lanthanum oxide (according to Branch Standard C¶b 48-194-8, grade 4 gallium oxide (according to Standard Specifications b‰ 6-09-5729-80), silicon oxide (Standard Specifications b‰ 48-4-360-75, and grade 99.99 metallic gallium (according to Standard Specifications b‰ 48-4-350-75. There are mixed together 48.04 g of 99.99% purity lanthanum oxide, 28.83 g of 99.99% purity gallium oxide, 5.86 g of 99.99% air-purity silicon oxide, and 12.49 g of molten metallic gallium. To attain more complete running of the reaction, the resultant mixture is briquetted into tablets which are placed in a horizontal reaction vessel to which oxygen is fed at a rate of 5 l/h. Then the mixture is subjected to local heating until the reaction of spontaneous high-temperature synthesis starts running in an electric arc. The synthesis time is from 5 to 15 min, the oxygen feed rate in afterburning is 5 l/h, the cool-down time to room temperature is 40 to 60 min. The starting charge prepared by the proposed method corresponds to the composition of $La_3Ga_5SiO_{14}$. The charge taken in an amount of 6.5 kg is loaded in a crucible made of 99.99% purity iridium and having a diameter of 120 mm made of 99.99% purity iridium. Then the crucible filled with the charge is placed in the chamber of a crystal growing apparatus, the chamber is evacuated to a pressure of $10^{-4}$ Hg, and an argon-air mixture is admitted thereto till a pressure of 1.2 atm is attained. The air is preliminarily dried with liquid nitrogen in a nitrogen trap. The air concentration in the argon-air mixture is 10 vol. %, the purity of argon is 99.998%. The crucible is induction-heated till a complete melting of the charge. A total content of admixtures in the melt as determined by the mass-spectrometric analysis is not in excess of $5 \times 10^{-4}$ wt. %. The resultant melt is held for 15 hours prior to bringing the melt surface in contact with a seed crystal oriented along the direction of <01.>±15, and the pressure of the argon-air mixture in the growing chamber is reduced to 1.05 atm. Then the rotational speed of the seed crystal is set at 28 rpm, the seed crystal is brought in contact with the melt surface, and the oriented langasite crystal is pulled from the melt at a rate which changes in the course of growing from 2.5 to 1.5 mm per hour. The resultant crystal has a weight of 3.65 kg and a diameter of an inscribed circle of the cylindrical portion equal to 80 mm. Once the crystal has been grown completely, it is cooled down in the growing chamber to room temperature for at least 24 hours. Next the volumetric crystal is held at 1423 K for 24 hours in an argon atmosphere at a pressure of 1.6 atm. Checking the crystal in the beam of a helium-neon laser for presence of scattering centers therein demonstrates the crystal to be free from such centers. Moreover, the heat-treatment procedure mentioned before avoids any mechanical stresses in the resultant langasite crystal and modifies coloration of the specimen crystals. The thus-grown crystals have the orientation of <01.1>. Wafers are cut from the crystals at the right angles to the growth axis.

Industrial Applicability

The langasite wafer shaped as a dia. 75–80 mm disk, proposed in the present invention can find widespread application in SAW-devices. The proposed methods of growing langasite crystals and preparing a charge for crystal growing allows of producing stoichiometric-composition single crystals having a minimum diameter of 75 mm and a minimum weight of 3.5 kg. The process of growing langasite crystals is ecologically pure and the resultant crystals are free from optically detectable scattering centers.

What is claimed is:

1. A method of preparing a charge for growing single crystals of langasite, comprising mixing the oxides of lanthanum, gallium, and silicon, followed by heating the resultant mixture, CHARACTERIZED in that metallic gallium is added to the mixture of oxides in the following ratio: $La_2O_3:Ga_2O_3:SiO_2=1:(0.2-0.3):(0.68-0.55):0.12$, heating being conducted in the presence of an oxidant locally and transiently before the reaction of spontaneous high-temperature synthesis starts running.

2. The method of claim 1, CHARACTERIZED in that a local transient heating is carried out in an electric arc.

3. A method of growing single crystals of langasite by the Czochralski method, comprising loading a crucible with a charge corresponding to the composition of $La_3Ga_5SiO_{14}$, creating a shielding atmosphere followed by melting the charge, bringing the rotating oriented seed crystal in contact with the melt surface, and pulling the oriented crystal from the melt, CHARACTERIZED in that loaded in the crucible is the charge prepared as claimed in claim 1, the molten charge is held for 2 to 15 hours, the shielding atmosphere is established using a mixture of argon or nitrogen with atmospheric air taken in amount of from 2 to 15 vol. % with a total pressure of from 1.10 to 1.80 atm, which is reduced a value falling within the range of 1.00 to 1.09 atm prior to contacting the seed crystal with the melt.

4. The method of claim 3, CHARACTERIZED in that the oriented seed crystal is rotated at 20 to 35 rpm.

5. The method of claim 3, CHARACTERIZED in that used as the oriented seed crystal is a langasite crystal oriented in the direction of <01.1>±3°.

6. The method of claim 3, CHARACTERIZED in that once the crystals have been grown, they are held for 20 to 36 hours in the argon atmosphere at a temperature of from 1300 to 1673 K and a pressure of from 1.1 to 1.8 atm.

7. A langasite disk-shaped wafer for use in devices operating on surface-acoustic waves, CHARACTERIZED in that it is cut from single crystals of langasite as prepared according to claim 3, the disk diameter is in the range of from 75 to 80 mm, and the disk has base cut.

8. The method of claim 1, CHARACTERIZED in that before being heated the mixture of the oxides of lanthanum, gallium, and silicon is briquetted.

* * * * *